(12) United States Patent  (10) Patent No.: US 7,421,031 B2
Neubert  (45) Date of Patent: Sep. 2, 2008

(54) METHOD FOR INITIALIZING THE COMPUTATION OF A QUASI-PERIODIC STEADY STATE OF A MULTI-TONE SYSTEM

(75) Inventor: Rolf Neubert, Unterhaching (DE)

(73) Assignee: Infineon Technologies AG, Munich (DE)

( * ) Notice: Subject to any disclaimer, the term of this patent is extended or adjusted under 35 U.S.C. 154(b) by 659 days.

(21) Appl. No.: 10/855,946

(22) Filed: May 28, 2004

(65) Prior Publication Data

US 2005/0265464 A1    Dec. 1, 2005

(51) Int. Cl.
*H04K 1/10* (2006.01)
(52) U.S. Cl. ....................... 375/260
(58) Field of Classification Search ........... 375/260, 375/222, 377, 261, 219; 716/4, 5
See application file for complete search history.

(56) References Cited

U.S. PATENT DOCUMENTS 5,995,733 A * 11/1999 Roychowdhury ........... 716/6
7,007,253 B2 * 2/2006 Gullapalli et al. ........... 716/5
2005/0102124 A1 * 5/2005 Root et al. .................. 703/14

OTHER PUBLICATIONS

Kundert, K., "Simulation Method of RF Integrated Circuits," IEEE, 1997, pp. 752-765.

* cited by examiner

*Primary Examiner*—Khai Tran
(74) *Attorney, Agent, or Firm*—Slater & Matsil, L.L.P.

(57) ABSTRACT

The invention refers to a method for initializing the computation of a quasi-periodic steady state of a multi-tone system, and to a computer program product for carrying out such a method. The method for initializing the computation of a quasi-periodic steady state of a multi-tone system comprises the following steps: (a) selecting a first one of the plurality of tones, and (b) performing a transient analysis over several periods with respect to the first selected tone, while keeping all periodic input sources of the multi-tone system with frequencies that are not multiples of the first selected tone constant. Afterwards, a single-tone Fourier transform of the results of the transient analysis is performed.

13 Claims, 5 Drawing Sheets

METHOD FOR INITIALIZING THE COMPUTATION OF A QUASI-PERIODIC STEADY STATE OF A MULTI-TONE SYSTEM

TECHNICAL FIELD OF THE INVENTION

The invention relates to a method for initializing the computation of a quasi-periodic steady state of a multi-tone system, and to a computer program product for carrying out such a method.

BACKGROUND OF THE INVENTION

Due to the increasing complexity of electronic systems—caused by, e.g., higher integration density, increased functionality, etc.—a structured, for instance, a "top down", "bottom up," or similar conventional approach to design has become necessary.

In a top down approach for instance, the design of a particular electronic system is started at a relatively high level of abstraction, whereafter the respective design is progressively refined at increasingly lower levels of abstraction (e.g., starting from a "system module level" down to a "circuit level", etc.).

Thereby, at each level of abstraction, appropriate tests and/or simulations are carried out; in case of faults the design result must be modified, and/or the corresponding design step repeated, or the design started anew at a higher level.

This design approach ensures that, despite the increased system complexity, the designed system operates in a fault-free fashion.

The test/simulation of so-called multi-tone systems is of particular importance.

In such systems, the multiple occurring input frequencies ("tones") (i.e., the frequencies of the input signals $frf_1$, $frf_2$, ..., and the frequency of a local oscillator flo, etc.) are in general incommensurable; hence, no common base frequency exists for such a system.

A steady state x(t) (vector containing all unknown variables) of a multi-tone system with incommensurable frequencies is quasi-periodic and may be represented as a multi-dimensional Fourier series (for sake of simplicity here given for two frequencies ("tones") $f_1$ and $f_2$, only)

$$x(t) = \sum_{-\infty}^{\infty}\sum_{-\infty}^{\infty} c_{i_1 i_2} e^{j i_1 2\pi f_1 t} e^{j i_2 2\pi f_2 t}$$

In the state of the art, methods to compute such quasi-periodic steady states are well-known, e.g., from V. Rizzoli, C. Cecchetti, A. Lipparini, F. Mastri, general-purpose harmonic balance analysis of nonlinear microwave circuits under multitone excitation, IEEE transactions on microwave theory and techniques, vol. 36, No. 12, December 1988, pages 1650-1660, the contents of which is incorporated herein by reference.

According to such methods, the unknown vector of multi-dimensional Fourier coefficients ($c_{i_1 i_2}$) might be computed concentrating on combinations of frequencies ("mixing products") of interest only, and, e.g., not taking into account the further combinations of frequencies.

For example, from the set of possible linear combinations of the n tones of the system:

$$\left|\sum_{j=1}^{n} i_j f_j\right|$$

($i_j$ integer, mixing order$\leq i_j \leq$mixing order, j=1, ..., n)

for the above computation, only frequencies up to a certain mixing order might be used. For example, only those frequencies as selected according to, e.g., one of the "diamond rule" and the "box rule":

Diamond rule:

$$\sum_{j=1}^{n}|i_j| \leq \text{mixing-order}$$

or $$\sum_{j=1}^{n} i_j = 0$$

Box rule:

$$|i_j| \leq \text{mixing-order}$$

However, since the above system equations for the multi-dimensional Fourier series in general are nonlinear, the solution can only be obtained by applying an iterative solver, e.g., "Newton's method". An iterative solver such as "Newton's method" requires an initial guess of the solution (i.e., for the unknown Fourier coefficients).

A bad guess might lead to a poor and time-consuming convergence, or even to a failure of the respective iterative method for computing the unknown Fourier coefficients.

Even in case of convergence, a bad guess might lead to false solutions due to an incorrect initialization of circuit parts that comprise memory, e.g., frequency dividers.

SUMMARY OF THE INVENTION

The invention includes a method for initializing the computation of a quasi-periodic steady state of a multi-tone system, and a novel computer program product for carrying out such a method.

These and other aspects of the invention are, e.g., achieved as set forth in the claims.

According to an aspect of the invention, a method for initializing the computation of a quasi-periodic steady state of a multi-tone system comprises the following steps:

(a) selecting a first one of the plurality of tones;
(b) performing a transient analysis (e.g., a time-domain integration of the underlying dynamical equations of the system) over several periods with respect to a first selected tone, while keeping all periodic input sources of the multi-tone system with frequencies that are not multiples of the first selected tone constant.

Afterwards, a single-tone Fourier transform of the results of the transient analysis is performed to initialize the Fourier coefficients of the harmonics of the first selected tone.

Thereafter, the above steps (a) and (b) as well as the following Fourier transform can be performed sequentially for all the tones of the system.

These and other features, aspects, and advantages of the present invention will be more fully understood when con-

Throughout the drawings, identical references numbers are used to designate identical components or components having identical functions, if not indicated elsewhere in the description.

DETAILED DESCRIPTION OF THE INVENTION

Figure 1:
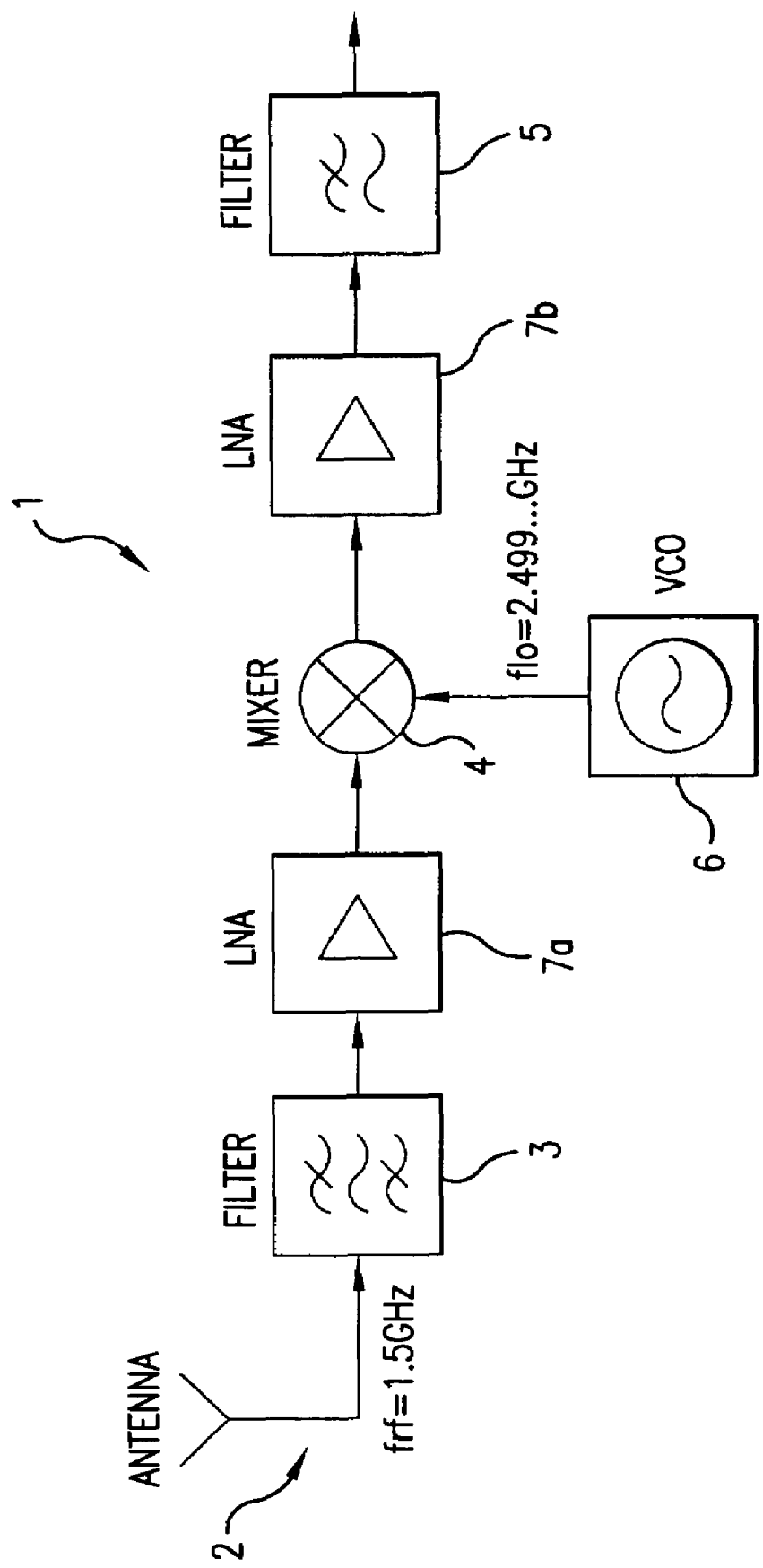
FIG. 1 is a simplified, schematic block diagram of a multi-tone system for which an initialization method according to an embodiment of the invention can be applied.

FIG. 1 is a simplified, schematic block diagram of a multi-tone system 1 for which an initialization method according to an embodiment of the invention can be applied.

During the design of the system 1, appropriate tests and/or simulations are being carried out; in case of faults, the design result must be modified, and/or the corresponding design step repeated, etc.

The simplified, schematically shown multi-tone system 1 of FIG. 1 comprises an antenna 2, a band-pass filter 3, a mixer 4 (for example, a down-converting mixer 4), a low-pass filter 5, a local oscillator 6 (for example, a VCO (voltage controlled oscillator), and two low-noise amplifiers (LNA) 7a, 7b.

The antenna 2 transmits the received input signal to the filter 3, where the input signal is filtered. The filtered signal (for example, a signal having a frequency frf=2.5 GHz) is transmitted via the LNA 7a to the mixer 4.

The signal which is output by the VCO (for example, a signal having a frequency flo≈2.499 GHz) is also fed to the mixer 4.

The mixer 4 mixes the signals received from the VCO 6, and the filter 3 (e.g., performs a respective multiplication).

In the multi-tone system 1, the multiple occurring frequencies ("tones"), such as the frequency of the input signal frf and the frequency of the VCO 6 flo, are incommensurable; hence, no common base frequency exists for this system 1.

A steady state x(t) (vector containing all unknown variables) of the multi-tone system 1 is quasi-periodic and may be represented as a multi-dimensional Fourier series ("Fourier equations").

Figure 3:
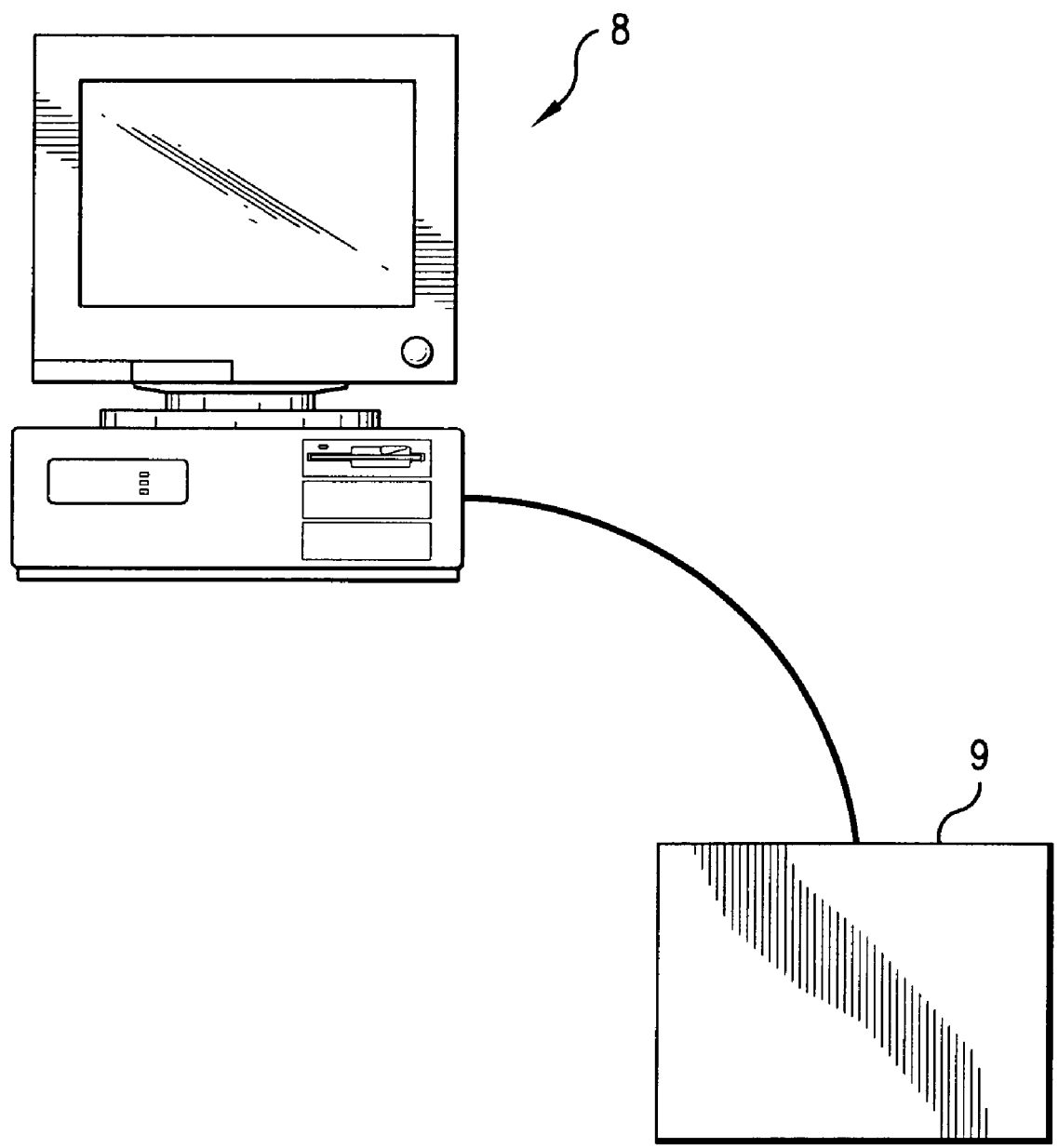
FIG. 3 shows a computer, and a storage means connected thereto, on which one or more computer programs are stored for carrying out the initialization method according to an embodiment of the invention.

FIG. 3 schematically shows a computer 8, and a storage means 9 connected thereto, on which one or more computer programs (e.g., the circuit simulator TITAN of INFINEON, and a respective control program, etc.) are stored for computing the above quasi-periodic steady states, and for calculating initializing values for such computation (i.e., for computing an "initial guess" of the solution of the above equations (i.e., for computing "initial guess" values for the unknown Fourier coefficients of the above multi-dimensional Fourier series)).

Referring again to FIG. 1, and the embodiment of the multi-tone system 1 shown therein, the "mixing" as performed by the mixer 4 (for example, a down-converting mixer 4) is based on frequency interaction.

This prohibits initialization based on small signal (AC) analysis around a DC operating point, since this would lead to a linear time invariant (LTI) system. In LTI systems, frequencies are independent from each other, i.e., they do not interact.

In single-tone systems, it is known that initializing values (i.e., an "initial guess" for the values of unknown Fourier coefficients) might be computed by carrying out a so-called transient analysis, i.e., a time-domain integration of the underlying dynamical equations, over several periods, followed by a Fourier transform that initializes the Fourier coefficients to provide "initial guess" values for the unknown Fourier coefficients. See, e.g., Bronstein, Semendjajew, Taschenbuch der Mathematik, Leipzig, Horneber, E.-H.: Simulation elektrischer Schaltungen auf dem Rechner, 1985, Computer-aided modeling, analysis, and design of communication systems, IEEE Trans. SAC 2 (1984) 1, the contents of which are incorporated herein by reference).

However, since in multi-tone systems 1 as shown in FIG. 1 with incommensurable frequencies, the respective period is infinite, the above initialization method used for single-tone systems is not applicable.

Hence, conventionally, instead, the DC operating point was used as an initial guess for the zero-th Fourier coefficient, having several disadvantages, as will be described in further detail below.

Preferably, instead, according to an embodiment of the invention, and under control of the above software program(s) stored on the storage means 9, the initialization method described hereinafter can be used for computing "initial guess" values of the unknown Fourier coefficients:

For n selected tones of the occurring tones of a multi-tone system (i.e., the frequencies of the input signals, and the frequencies of one or more local oscillators), n separate initializations are performed, each initialization being similar to the above-mentioned single-tone system initialization.

Figure 2:
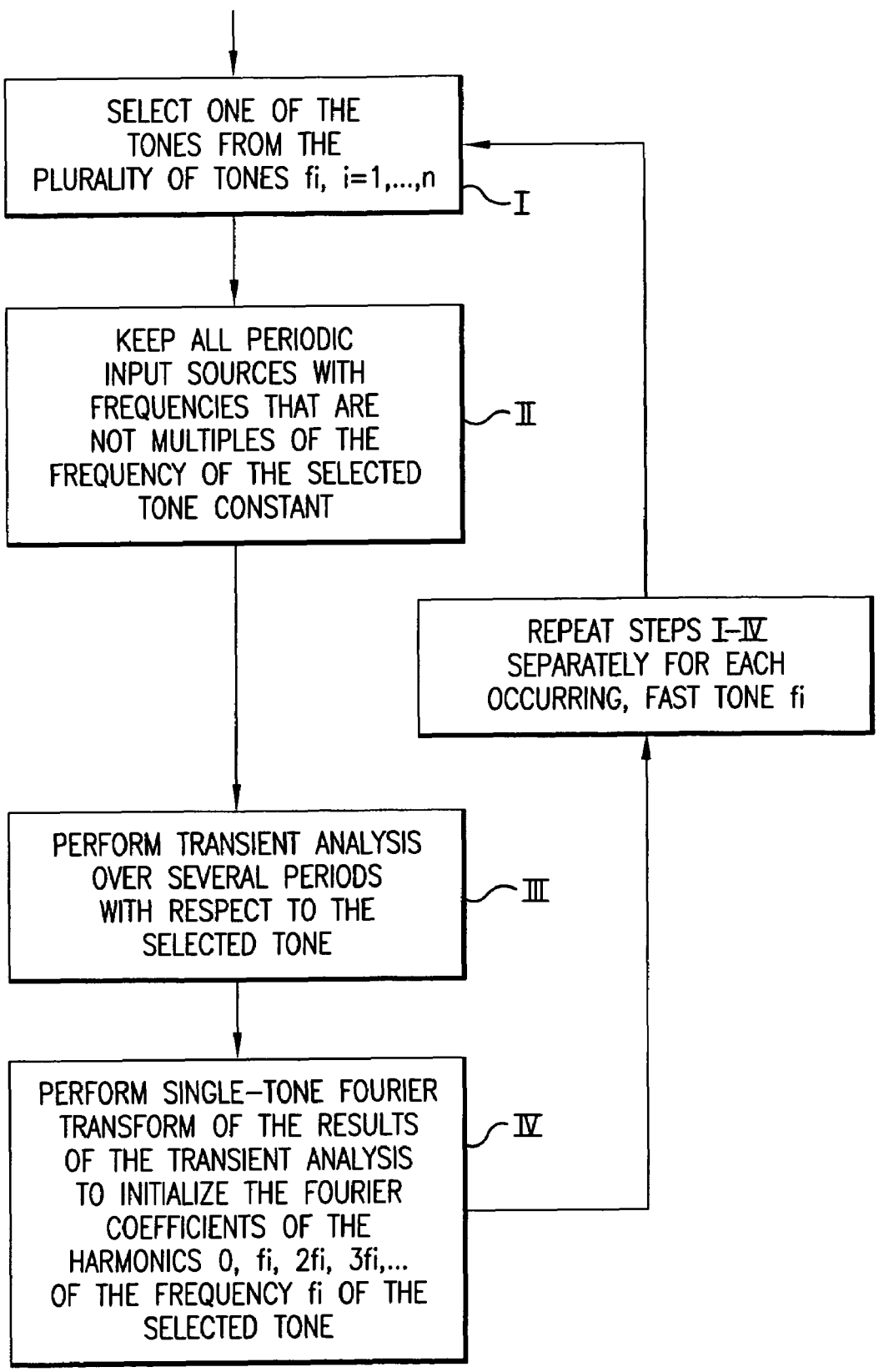
FIG. 2 is a flow chart for schematically showing the steps performed in the initialization method according to an embodiment of the invention.

In further detail, for each selected tone $f_i$, i=1, ..., n of the system (for example, for the multi-tone system 1 as shown in FIG. 1, for the frequencies frf=2.5 GHz, etc. occurring in the system) the steps I), II), III), and IV) as shown in FIG. 2 are carried out:

In a first step I), as is shown in FIG. 2, automatically, under control of the above software program(s), a first one of the tones from the plurality of tones is selected. This first tone $f_1$ might be selected randomly, e.g., starting with the tone with the highest frequency.

For the multi-tone system 1 as shown in FIG. 1, for example, the input signal tone with the frequency frf=2.5 GHz can be selected as a first selected tone (i.e., $f_1$=2.5 GHz).

Then, for performing a respective first analysis, all input sources ("tones", i.e., input signals, local oscillators) with frequencies that are not multiples of the frequency of the selected tone (e.g., do not have a frequency of 0, $f_1$, $2f_1$, $3f_1$, ...) are kept constant (see, e.g. the second step II) as shown in FIG. 2.

Keeping the non-selected tones (in particular, the amplitudes of the respective tones) constant, a transient analysis, i.e., a time-domain integration of the underlying dynamic equations, with respect to the frequency $f_1$ of the first selected tone (in particular, with respect to $T=1/f_1$), is performed over several periods (e.g., for the multi-tone system 1 for the frequency $f_1$=frf, as is known for single-tone systems).

Thereafter, corresponding to what is known for single-tone systems, under control of the above software program(s) a single-tone Fourier transform of the results of the above transient analysis is performed, the results of which are used to initialize the Fourier coefficients of the harmonics of the frequency $f_1$ of the first selected tone (i.e., the coefficients of the multiples of the frequency $f_1$ (0, $f_1$, $2f_1$, $3f_1$, ...)).

Those coefficients are later used as "initial guess" values for the first set of unknown Fourier coefficients (referring to frequencies 0, $f_1$, $2f_1$, $3f_1$, ... of the harmonics of the frequency $f_1$ of the—first—selected tone).

Then, correspondingly, a second, separate initialization can be carried out (i.e., the steps I-IV) can be repeated for a second selected tone).

Therefore, a second one of the tones from the plurality of tones is selected, having a tone with a frequency $f_2$ This second tone $f_2$ can be selected randomly (e.g., the tone with the second-highest frequency might be selected as the second tone $f_2$).

Then, again, all input sources with frequencies that are not multiples of the frequency of the second selected tone (e.g., do not have a frequency of 0, $f_2$, $2f_2$, $3f_2$, ...) are kept constant (see, e.g., the second step II) as shown in FIG. 2.

Keeping the above (non-selected) tones (in particular, the amplitudes of the respective tones) constant, a transient analysis is performed over several periods, this time with respect to the frequency $f_2$ of the second selected tone.

Thereafter (corresponding to what is known for single-tone systems), under control of the above software program(s), a single-tone Fourier transform of the results of the second transient analysis is performed, the results of which are used to initialize the Fourier coefficients of the harmonics of the frequency $f_2$ of the second selected tone (i.e., the coefficients of the multiples of the frequency $f_2$ (0, $f_2$, $2f_2$, $3f_2$, ...).

Those coefficients are later used as "initial guess" values for the second set of unknown Fourier coefficients (referring to frequencies 0, $f_2$, $2f_2$, $3f_2$, ... of the harmonics of the frequency $f_2$ of the second selected tone).

The above steps I)-IV), as shown in FIG. 2, can be repeated for all n occurring frequencies ("tones") of the respective multi-tone system, such that in the end "initial guess" values for all relevant Fourier coefficients are computed.

Figure 4:
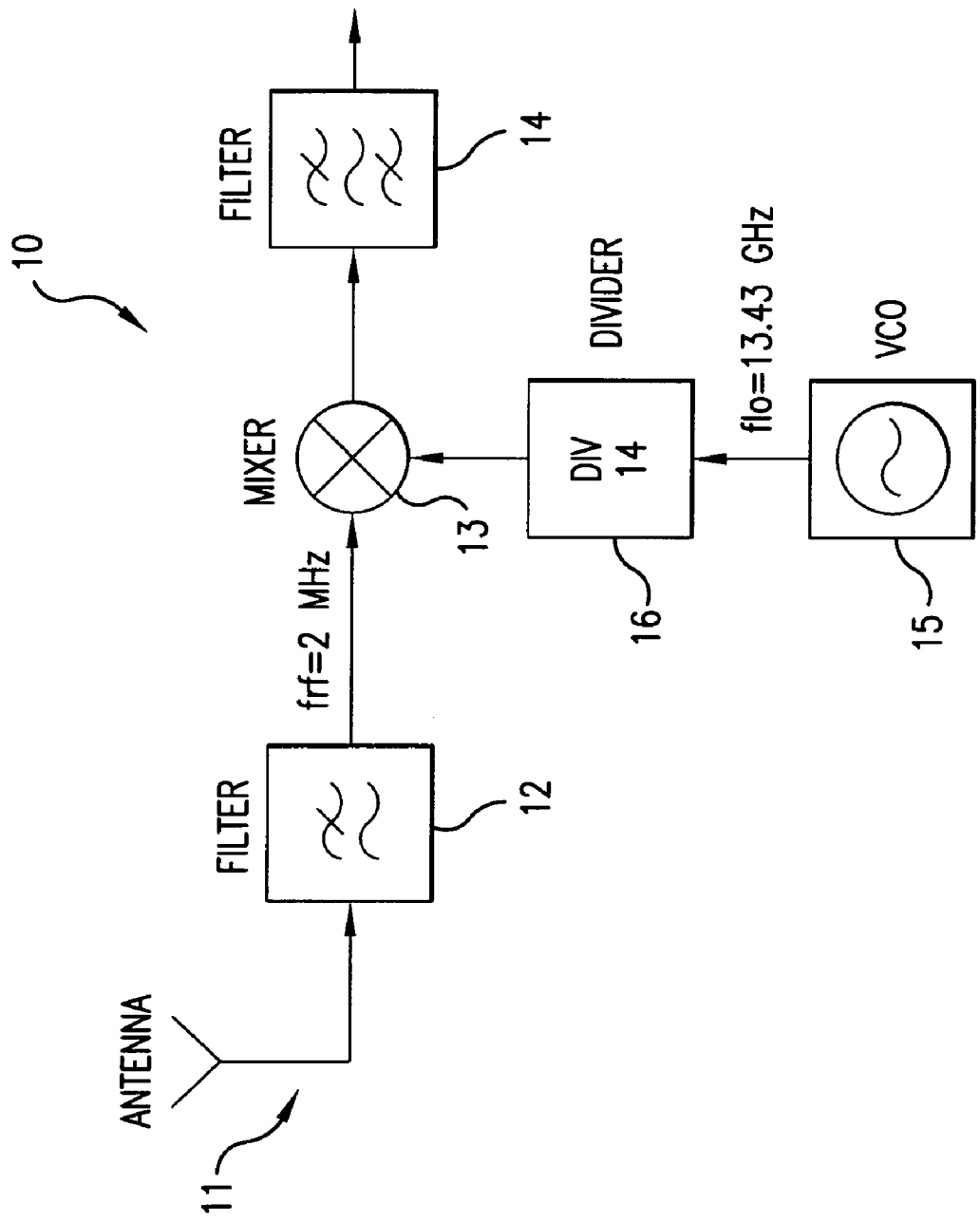
FIG. 4 is a simplified, schematic block diagram of a further multi-tone system for which an initialization method according to an embodiment of the invention can be applied.

FIG. 4 shows a simplified, schematic block diagram of an alternative multi-tone system 10 for which an initialization method according to an embodiment of the invention can be applied.

The simplified, schematically shown multi-tone system 10 of FIG. 4 comprises an antenna 11, a low-pass filter 12, a mixer 13 (for example, an up-converting mixer 13), a band-pass filter 14, a local oscillator 6 (for example, a VCO (voltage controlled oscillator 15)), and a frequency divider 16.

The antenna 11 transmits the received input signal to the filter 12, where the input signal is filtered. The filtered signal (for example, a signal having a frequency frf=2 MHz) is transmitted to the mixer 13.

The signal which is output by the VCO (for example, a signal having a frequency flo=13.43 GHz) is fed to the divider 16, which performs a frequency division (for example, divides the frequency of the input signal by four), and transmits the frequency-divided signal to the mixer 13.

The mixer 13 mixes the signals received from the divider 16, and the filter 12 (e.g., performs a respective multiplication).

In the multi-tone system 10, just as in the multi-tone system 1 shown in FIG. 1, the multiple occurring frequencies ("tones") (i.e., the frequency of the input signal frf, the frequency of the VCO 6 flo (more precisely: the divided frequency flo/4, etc.)) are incommensurable; hence, no common base frequency exists for this system 1.

For the system 10 shown in FIG. 4, just as for the system 1 shown in FIG. 1, method steps I)-IV) corresponding to those shown in FIG. 2 can be repeated for all n occurring frequencies ("tones") of the multi-tone system 10, such that in the end "initial guess" values for all relevant Fourier coefficients are computed.

In an alternative method, the initialization is only applied to the fast tones in the system (e.g. the fastest tone, or the two, three, four, etc. fastest tones). For example, for the multi-tone system 10 shown in FIG. 4, comprising the up-converting mixer 13 initialization is only applied to the tone of the VCO 15, or, more precisely, because of the divider 16, only for flo/4).

In other words, the above steps I)-IV), as shown in FIG. 2, might not be repeated for all occurring tones, but, instead, only for the fast tones of the multi-tone system 10.

By applying the above methods, the harmonics with respect to each (or each selected) tone are initialized, neglecting the respective mixing products.

Further, by applying the above methods, other than is the case in conventional methods, all sub-parts of the system which comprise a memory (e.g. the frequency divider 16 of the multi-tone system 10, which can comprise a flip-flop) are correctly initialized, since several periods of a transient analysis with respect to each selected tone are performed.

According to the above alternative method, by applying the initialization to only the fast tones in the system, the efficiency of the transient analysis is improved.

The "initial guess" values of the Fourier coefficients, as calculated according to the above methods, are used as initial values for computing the quasi-periodic steady states of the respective multi-tone system (e.g., the system 1 as shown in FIG. 1), under control of the above software program(s) and by making us of a method such as described by V. Rizzoli, C. Cecchetti, A. Lipparini, F. Mastri, general-purpose harmonic balance analysis of nonlinear microwave circuits under multitone excitation, IEEE transactions on microwave theory and techniques, vol. 36, No. 12, December 1988, pages 1650-1660 (the contents of which is incorporated herein by reference), or a corresponding method.

Thereby, the unknown vector of the multi-dimensional Fourier coefficients ($c_{i1 i2}$) of the respective multi-tone system is computed concentrating on the combinations of frequency ("mixing products") of interest, applying an iterative solver, e.g., "Newton's method", and requiring an initial guess of the solution (such as the "initial guess" values for the Fourier coefficients as calculated by once or several times carrying out the above steps I)-IV)).

For most systems, the above initialization leads to a rapid convergence to the correct solution.

Consequently, it removes the drawbacks of an initialization based on pure DC analysis, and allows an efficient computation of quasi-periodic steady states in multi-tone systems.

To further illustrate the characteristics of the above initialization method, in the following, the quality and rapidness of quasi-periodic steady state computations are compared, applying i) a conventional initialization method, using the DC operating point as the zero-th Fourier coefficient, and ii) the above-described, new initialization method.

As a measure for the quality of the steady state computation, in particular, the first approximation, the initial residual of the system's equations at the beginning of the iteration, might be used.

Further, as a measure for the rapidness of a quasi-periodic steady state computation, the speed of convergence might be used, measured by the number of performed iterations.

TABLE 1

|  | Initial Residual | Number of iterations to reach convergence |
|---|---|---|
| Conventional method | 4.0 | 14 |
| New method | 1.2 | 8 |

As might be seen from Table 1, for the multi-tone system 10 of FIG. 4, the convential method did converge, but due to the missing initialization of the frequency divider 16 the latter remained in its zero state, i.e., did not work. Consequently, the computed quasi-periodic state is erroneous, i.e., the conventional method failed in computing the correct solution.

In contrast, the new method, even if carried out only for fast tones (for example, only the fast tone of the local oscillator VCO 15, more precisely: flo/4)), rapidly obtained the correct solution. This is due to better initialization of the harmonics of the local oscillator (VCO 15), when compared to the conventional method).

In Table 2 below, the quality and rapidness of quasi-periodic steady state computations for a further multi-tone system 17 are compared, namely, for the Gilbert mixer 17 (enhanced by a cascode stage to yield better linearity) as shown in FIG. 5, again applying i) a conventional initialization method, using the DC operating point as the zero-th Fourier coefficient, and ii) the above-described, new initialization method.

TABLE 2

|  | Initial Residual | Number of iterations to reach convergence |
|---|---|---|
| Conventional method | 1.2 | 14 |
| New method | 0.425893E−02 | 4 |

Thereby, the quasi-periodic steady state was computed using as input signal frequency a frequency frf=950.121357 MHz, and as frequency of the local oscillator a frequency flo=961.345345 MHz.

Figure 5:
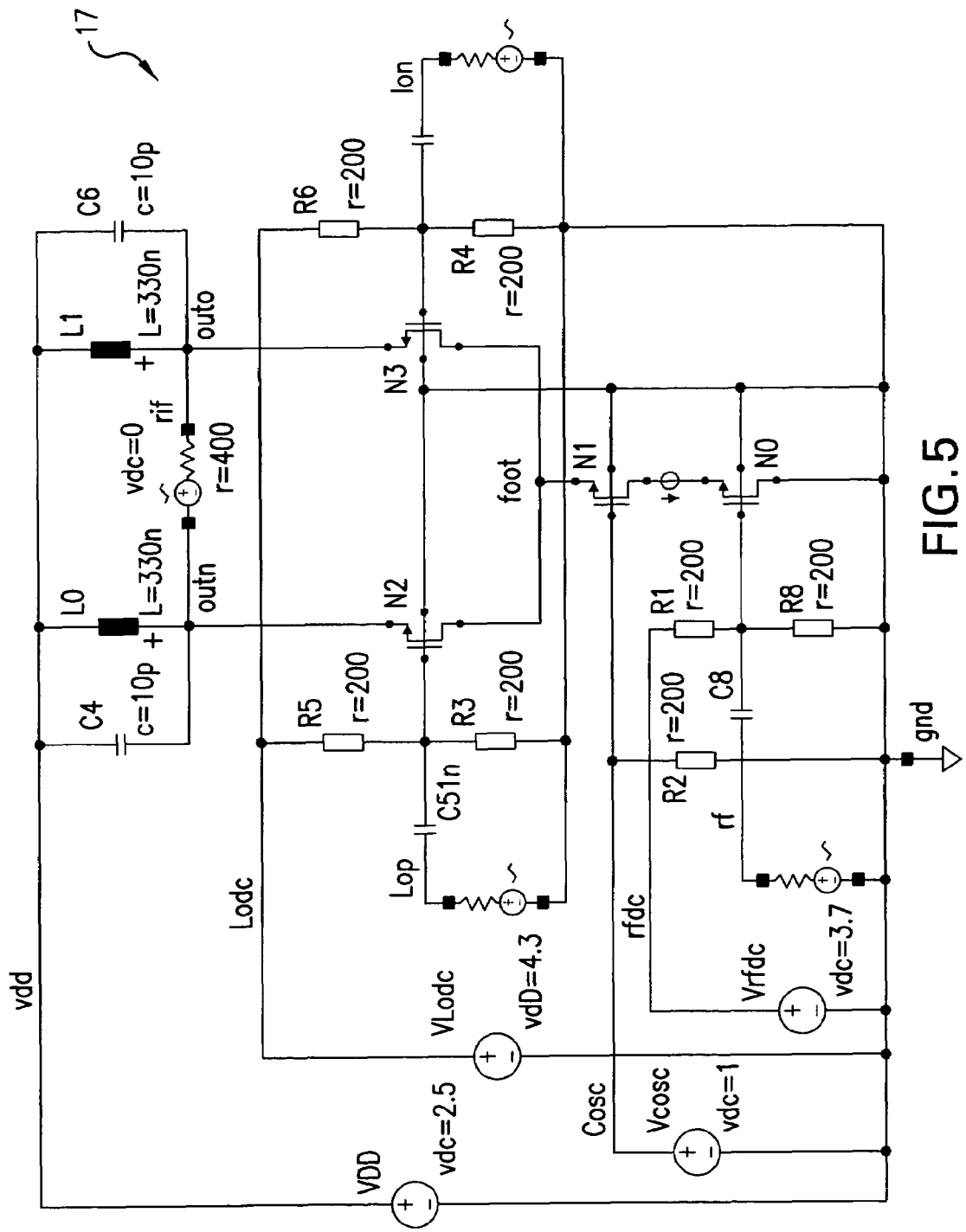
FIG. 5 shows an additional example of a multi-tone system.

As might be seen from Table 2, for the multi-tone system 17 of FIG. 5, the initial guess provided by the new method is much closer to the final solution than the initial guess provided by the conventional method, leading to a much faster convergence.

While exemplary embodiments have been described in detail and shown in the accompanying drawings, it is to be understood that such embodiments are merely illustrative of, and not restrictive on, the broad invention. It will thus be recognized that various modifications may be made to the illustrated and other embodiments of the invention, without departing from the scope and spirit of the invention as defined by the appended claims.

What is claimed is:

1. A method for initializing the computation of a quasi-periodic steady state of a multi-tone system, comprising:
    (a) selecting a first one of a plurality of tones;
    (b) performing a transient analysis over several periods with respect to the first selected tone, while keeping constant all periodic input sources of the multi-tone system with frequencies that are not multiples of the first selected tone.

2. The method of claim 1, further comprising the step of:
    (c) performing a single-tone Fourier transform of results of the transient analysis to initialize Fourier coefficients of harmonics of the first selected tone.

3. The method of claim 1, further comprising the steps of:
    (d) selecting a second one of the plurality of tones;
    (e) performing a transient analysis over several periods with respect to the second selected tone, while keeping constant all periodic input sources of the multi-tone system with frequencies that are not multiples of the second selected tone.

4. The method of claim 3, further comprising the step of:
    (f) performing a single-tone Fourier transform of results of the transient analysis to initialize Fourier coefficients of harmonics of the second selected tone.

5. The method of claim 1, further comprising the steps of: repeating steps (a) and (b) for all of the tones of the multi-tone system.

6. The method of claim 2, further comprising the steps of: repeating steps (a), (b) and (c) for all of the tones of the multi-tone system.

7. The method of claim 1, wherein the multi-tone system comprises a memory.

8. The method of claim 7, wherein the multi-tone system comprises a frequency divider comprising the memory.

9. A method for initializing the computation of a quasi-periodic steady state of a multi-tone system, comprising:
    (a) selecting a first one of a plurality of tones;
    (b) performing a transient analysis over several periods with respect to the first selected tone, while keeping constant all periodic input sources of the multi-tone system with frequencies that are not multiples of the first selected tone;
    (c) performing a single-tone Fourier transform of results of the transient analysis; and
    (b) repeating the steps (a), (b) and (c) for other, but not all of the tones of the multi-tone system.

10. The method of claim 2, wherein steps (a), (b) and (c) are repeated for tones with a high frequency, and not for tones with a low frequency.

11. A method for initializing the computation of a quasi-periodic steady state of a multi-tone system, comprising:
    (a) selecting a first one of a plurality of tones;
    (b) performing a transient analysis over several periods with respect to the first selected tone, while keeping constant all periodic input sources of the multi-tone system with frequencies that are not multiples of the first selected tone; and
    (c) performing a single-tone Fourier transform of results of the transient analysis wherein the tone with the highest frequency is selected as the first one of the plurality of tones.

12. The method of claim 11, wherein steps (a), (b) and (c) are not repeated for any other tones.

13. A method for initializing the computation of a quasi-periodic steady state of a multi-tone system, comprising the following steps embodied on a computer readable storage means:
    (a) selecting a first one of a plurality of tones provided by said multi-tone system;
    (b) performing a transient analysis over several periods with respect to the first selected tone, while keeping constant all periodic input sources of the multi-tone system with frequencies that are not multiples of the first selected tone; and
    (c) performing a single tone Fourier transform of results of the transient analysis.

* * * * *

UNITED STATES PATENT AND TRADEMARK OFFICE
CERTIFICATE OF CORRECTION

| | |
|---|---|
| PATENT NO. | : 7,421,031 B2 |
| APPLICATION NO. | : 10/855946 |
| DATED | : September 2, 2008 |
| INVENTOR(S) | : Neubert |

It is certified that error appears in the above-identified patent and that said Letters Patent is hereby corrected as shown below:

In Col. 8, line 35, delete "2" and insert --9--.

Signed and Sealed this

Twenty-first Day of October, 2008

JON W. DUDAS
*Director of the United States Patent and Trademark Office*